United States Patent
Liu et al.

(10) Patent No.: US 10,800,004 B2
(45) Date of Patent: Oct. 13, 2020

(54) SYSTEM AND METHOD OF CHEMICAL MECHANICAL POLISHING

(71) Applicant: Taiwan Semiconductor Manufacturing Company, Ltd., Hsinchu (TW)

(72) Inventors: Chih-Wen Liu, Taoyuan (TW); Hao-Yun Cheng, Keelung (TW); Che-Hao Tu, Hsinchu (TW); Kei-Wei Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/252,183

(22) Filed: Jan. 18, 2019

(65) Prior Publication Data

US 2020/0101582 A1    Apr. 2, 2020

Related U.S. Application Data

(60) Provisional application No. 62/738,732, filed on Sep. 28, 2018.

(51) Int. Cl.
*B24B 57/02* (2006.01)
*B24B 37/10* (2012.01)
*H01L 21/306* (2006.01)
*B24B 37/30* (2012.01)
*B24B 37/04* (2012.01)

(52) U.S. Cl.
CPC ............ *B24B 57/02* (2013.01); *B24B 37/042* (2013.01); *B24B 37/107* (2013.01); *B24B 37/30* (2013.01); *H01L 21/30625* (2013.01)

(58) Field of Classification Search
CPC ..... B24B 57/02; B24B 37/042; B24B 37/107; B24B 37/30; H01L 21/30625
See application file for complete search history.

(56) References Cited

U.S. PATENT DOCUMENTS 5,755,614 A *   5/1998   Adams ................... B24B 37/04
                                                               451/60
6,203,412 B1*   3/2001   Quek .................... B24B 37/042
                                                              451/285

\* cited by examiner

*Primary Examiner* — Nadine G Norton
*Assistant Examiner* — Mahmoud Dahimene
(74) *Attorney, Agent, or Firm* — Slater Matsil, LLP

(57) ABSTRACT

A system controls a flow of a chemical mechanical polish (CMP) slurry into a chamber to form a slurry reservoir within the chamber. Once the slurry reservoir has been formed within the chamber, the system moves a polishing head to position and force a surface of a wafer that is attached to the polishing head into contact with a polishing pad attached to a platen within the chamber. A wafer/pad interface is formed at the surface of the wafer forced into contact with the polishing pad and the wafer/pad interface is disposed below an upper surface of the slurry reservoir. During CMP processing, the system controls one or more of a level, a force, and a rotation of the platen, a position, a force and a rotation of the polishing head to conduct the CMP processing of the surface of the wafer at the wafer/pad interface.

20 Claims, 6 Drawing Sheets

SYSTEM AND METHOD OF CHEMICAL MECHANICAL POLISHING

PRIORITY CLAIM AND CROSS-REFERENCE

This application claims priority to and the benefit of U.S. Provisional Application No. 62/738,732, filed on Sep. 28, 2018, and entitled "System and Method of Chemical Mechanical Polishing," which application is incorporated herein by reference.

BACKGROUND

Chemical mechanical polish (CMP) processes can be used for the fabrication of an integrated circuit. For example, CMP processes may be used to planarize metal features, semiconductor materials and inter-metal dielectrics of inter-level dielectric layers that separate various circuit layers in an integrated circuit. CMP processes are also commonly used in the formation of the copper lines and/or contact plugs that interconnect components of integrated circuits.

CMP processes are widely used in the fabrication of integrated circuits. As an integrated circuit is built up layer by layer on the surface of a semiconductor wafer, CMP processes are used to planarize the topmost layer or layers to provide a leveled surface for subsequent fabrication steps. However, improvements are still desired.

BRIEF DESCRIPTION OF THE DRAWINGS

The following aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
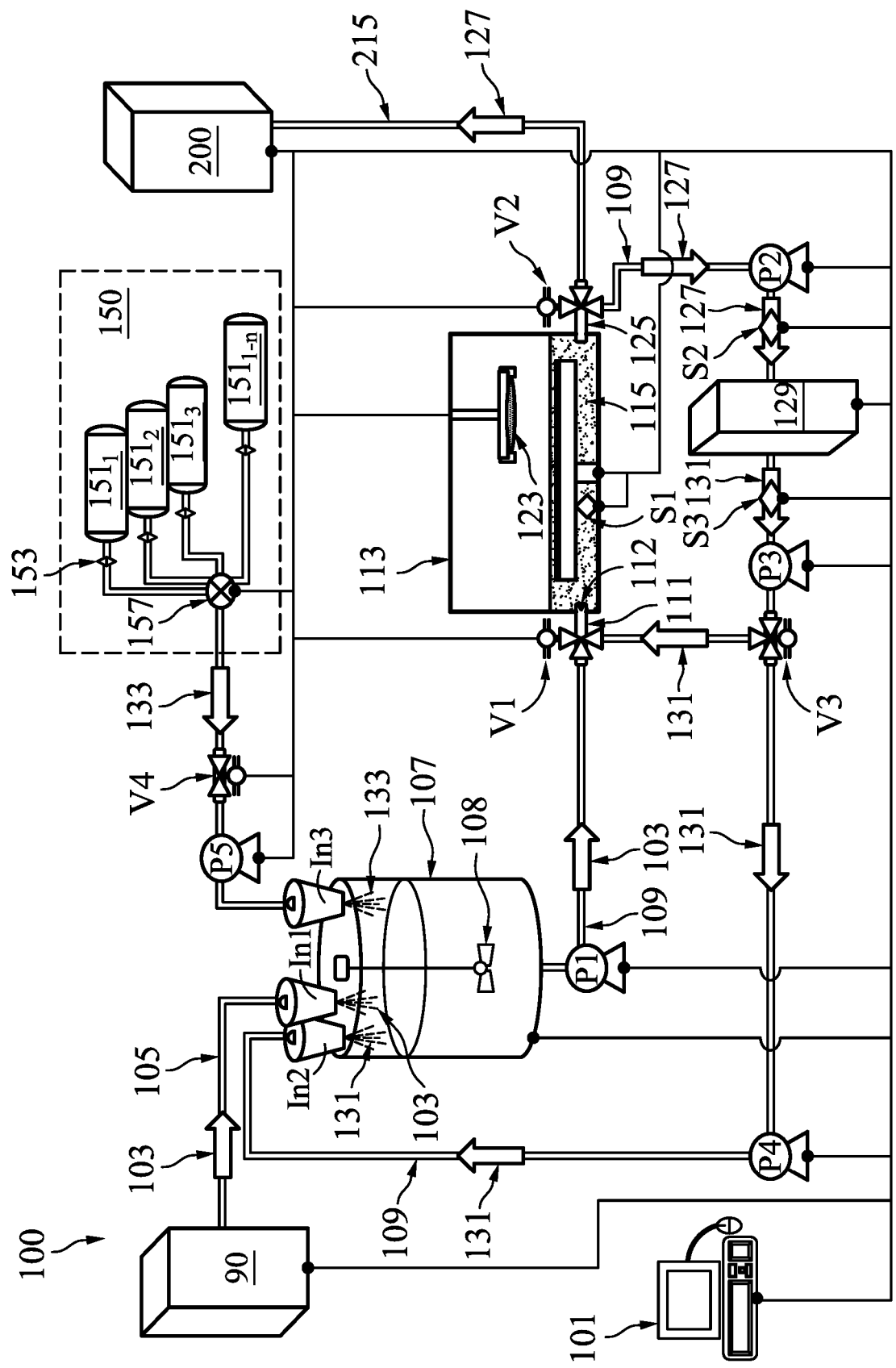
FIG. 1 illustrates a CMP processing system and method, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a CMP processing system 100, according to some embodiments. The CMP processing system 100 comprises a plurality of various components including: a supply tank 107, a chamber 113, a slurry filter 129, a slurry restoration system 150, a control unit 101, a plurality of pumps P1-P5, a plurality of valves V1-V4, and a plurality of sensors S1-S3. The various components of the CMP processing system 100 are interconnected and the control unit 101 controls the pumps P1-P5 and valves V1-V4 to flow CMP slurries and/or solutions through the conduit 109 during operation of the CMP processing system 100. (e.g., pipelines, tubing, channels, feedlines, combinations thereof, and the like). A general distribution and flow of a CMP slurry 103 within the CMP processing system 100 is indicated by a set of directional arrows in FIG. 1, according to some embodiments.

In preparation for performing a CMP process, the CMP processing system 100 receives the CMP slurry 103 from a feedline 105 of a slurry distribution system 90 and delivers the CMP slurry 103 via a first inlet In1 to the supply tank 107. The CMP slurry 103 may be a slurry prepared, for example, according to a desired CMP process recipe for use in a desired CMP processing of a workpiece 123 (e.g., semiconductor substrate, semiconductor wafer, etc.).

In some embodiments, the CMP slurry 103, in prepared form, may comprise a base slurry (e.g., an undiluted stock slurry comprising colloidal silica) that is mixed (e.g., in a mixing tank of the slurry distribution system 90) with one or more slurry diluents to dilute the base slurry and is mixed with one or more slurry additives prior to being delivered to the supply tank 107. In some embodiments, the supply tank 107 comprises an agitator 108 that provides a continuous stir of the components provided to the supply tank 107 ensuring a thorough mixing of the base slurry, the slurry diluents, and the slurry additives and ensuring a consistent quality of the characteristics of the CMP slurry 103 that is drawn out of the supply tank 107. Slurry diluents and slurry additives may include, but are not limited to, one or more of: abrasives, aqueous solutions (e.g., deionized water, ammonia), solvents, oxidizing agents, pH adjusters, complexing agents, chelating agents, corrosion inhibiting agents, and the like. All such slurry diluents and slurry additives and combinations thereof that are suited for the desired CMP process may be included without limitation and are considered to be within scope of the embodiments disclosed herein.

Initial steps in preparation for performing the desired CMP processing of the workpiece 123, may include placing the workpiece 123 in the chamber 113 and forming a slurry reservoir 115 within the chamber 113. In some embodiments, the control unit 101 controls the first pump P1 and the first valve V1 to allow the CMP slurry 103 to flow through an intake 111 and pool at the bottom of the chamber 113, thereby forming the slurry reservoir 115. The intake 111 is a point where the CMP slurry 103 enters the chamber 113 and mixes with the ambient of the chamber 113, such as, via a downstream port of the first valve V1 or an inlet main of the chamber 113. For example, the CMP slurry 103 flows into and mixes with the ambient of the chamber 113 via a delivery orifice 112 of the intake 111. According to embodiments, the delivery orifice 112 of the intake 111 is arranged at or near a bottom surface of the chamber 113. However, any suitable arrangement of the delivery orifice 112 of the intake 111 within the chamber 113 may be used. In some embodiments, the delivery orifice 112 provides a controlled flow of CMP slurry 103 into the ambient of the chamber 113. However, the delivery orifice 112 may allow for the CMP slurry 103 to freely flow into the ambient of the chamber 113. However, any suitable arrangement of the delivery orifice 112 may be used.

In some embodiments, the control unit 101 controls the first and second pumps P1-P2 and controls the first and second valves V1-V2 to control the flow of the CMP slurry 103 into and out of the chamber 113, according to the desired CMP process recipe. In some embodiments, the control unit 101 controls the first and second pumps P1-P2 and controls the first and second valves V1-V2 in order to adjust a level of the slurry reservoir 115, according to the desired CMP process recipe.

Once the slurry reservoir 115 has been formed, the desired CMP processing of the workpiece 123 may begin to planarize the surface of the workpiece 123. During the desired CMP processing, surface materials of the workpiece 123 may react with one or more slurry additives of the CMP slurry 103 and waste and impurities may collect in the slurry reservoir 115. As such, desired concentration levels of one or more slurry additives of the CMP slurry 103 in the slurry reservoir 115 may become depleted, may become reduced to ineffective levels, or may become imbalanced with respect to ratios between the one or more slurry additives and another one of the slurry additives. Consequently, the quality and characteristics of the CMP slurry 103 of the slurry reservoir 115 may become compromised such that concentration levels of one or more of the slurry additives may sit outside a tolerance level as dictated by the desired CMP process recipe. For example, the CMP slurry 103 of the slurry reservoir 115 may become compromised due to chemical reactions between components (e.g., an oxidizing agent) of the CMP slurry 103 of the slurry reservoir 115 and materials of the workpiece 123 consuming or otherwise altering the components of the CMP slurry 103. Furthermore during CMP processing, the CMP slurry 103 of the slurry reservoir 115 may become contaminated due to waste and impurities left behind during removal of surface materials of the workpiece 123. As such, when the quality or characteristics of the CMP slurry 103 of the slurry reservoir 115 has become compromised or has become contaminated (otherwise referred herein as a "used slurry 127"), the control unit 101 may initiate a purging of the slurry reservoir 115 to flow used slurry 127 out of the chamber 113.

In some embodiments, the control unit 101 may determine that all or some of the used slurry 127 may be re-usable or recyclable based on a degree of depletion, imbalance, compromise, or contamination of the used slurry 127. The control unit 101 may also determine when all or some of the used slurry 127 may be compromised and no longer re-usable or recyclable for the desired CMP process. Based on such determinations, the control unit 101 may initiate a purging of all or some of the used slurry 127 from the chamber 113.

Once purged from the chamber 113, the used slurry 127 may be filtered, restored, and recycled to the original condition and/or state of the CMP slurry 103, according to some embodiments. For example, the control unit 101 may initiate a purging of the used slurry 127 from the chamber 113 based on a concentration of waste and impurities in the used slurry 127 of the slurry reservoir 115. Once purging has been initiated, the control unit 101 controls the second pump P2 and the third pump P3 to draw the used slurry 127 through the slurry filter 129 to remove waste and impurities from the used slurry 127 and produce a filtered slurry 131 at an output of the slurry filter 129. As such, the filtered slurry 131 may be reused or recycled.

The slurry filter 129 removes oversized, large slurry particles or agglomerated clusters or clumps of particles which might otherwise scratch and damage the surface of the workpiece 123 during the CMP processing. In some embodiments, the slurry filter 129 may have pore sizes between about 0.02 μm and about 0.10 μm.

In some embodiments, based on a level of the concentration of waste and impurities in the used slurry 127, the control unit 101 may determine that the used slurry 127 should be disposed. As such, the control unit 101 initiates a purging of the used slurry 127 from the chamber 113 and directs the second valve V2 to open to allow the used slurry 127 to flow through the disposal line 215 to a Slurry Waste Disposal System 200 to discard the used slurry 127.

In some embodiments based on a level of the concentration of waste and impurities in the used slurry 127, the control unit 101 may determine that a portion of the used slurry 127 can remain in the slurry reservoir 115 as a remaining portion of the used slurry 127 and can be mixed with a supply of the filtered slurry 131. In some embodiments, based on a concentration of the waste and impurities in the used slurry 127, the control unit may determine that the remaining portion of the used slurry 127 can be mixed with a fresh supply of the CMP slurry 103 from the supply tank 107. In still other embodiments, based on a concentration of the waste and impurities in the used slurry 127, the control unit may determine that the remaining portion of the used slurry 127 can be mixed with a combination of the filtered slurry 131 and the fresh supply of the CMP slurry 103 from the supply tank 107.

In some embodiments based on a degree of depletion of the used slurry 127, the control unit 101 may determine that the used slurry 127 should be restored and recycled. As such, the control unit 101 initiates a purging of the used slurry 127 from the chamber 113 and directs the second valve V2 to open to allow the used slurry 127 to flow out of the chamber 113 and directs the second pump P2 and the third pump P3 to draw the used slurry 127 through the slurry filter 129 to filter the used slurry 127. Once filtered, the control unit 101 controls the third valve V3 and the fourth pump P4 to transfer the filtered slurry 131 to a second inlet In2 of the supply tank 107. As the filtered slurry 131 is transferred to the supply tank 107, the filtered slurry 131 may be restored by replenishing any depleted slurry diluent, replenishing any depleted additives, correcting any corrupted concentration levels, adjusting pH levels, or the like.

According to some embodiments, in order to restore the filtered slurry 131 to a composition and a state consistent with an original composition and an original state of the CMP slurry 103, the control unit 101 directs a slurry restoration system 150 to generate a make-up solution 133 to be mixed with the filtered slurry 131. In an embodiment, the slurry restoration system 150 comprises a plurality of make-up tanks 151 respectively coupled via a plurality of flow release valves 153 to a multi-input manifold 157. Each of the make-up tanks 151 contains a slurry diluent or a slurry additive of the types used in the original composition of the CMP slurry 103. According to some embodiments, the control unit 101 directs one or more of the flow release valves 153 to release an appropriate amount of the slurry diluent or an appropriate amount of the slurry additive contained in one or more respective make-up tanks 151 based on the degree of depletion, the degree of imbalance, or the degree of compromise of the used slurry 127. For example, the slurry restoration system 150 may release a make-up solution 133 including appropriate amounts of an acid solution or an alkaline solution (e.g., acetic acid, KOH, NaOH) to adjust a pH level of the used slurry 127 to restore the pH level of the used slurry 127 to the pH level of the original composition of the CMP slurry 103.

According to some embodiments, the multi-input manifold 157 may combine the released slurry diluents or the released slurry additives to provide the make-up solution 133. In some embodiments, the multi-input manifold 157 may individually provide each of the released slurry diluents or the released slurry additives as a series of solutions to be mixed with the used slurry 127, the series of solutions forming the make-up solution 133. As such, the control unit 101 directs the multi-input manifold 157, the fourth valve V4 and the fifth pump P5 to deliver the make-up solution 133 to a third inlet In3 of the supply tank 107. Therefore, the used slurry 127 purged from the chamber 113 may be recycled to restore the used slurry 127 to its original composition and its original state.

In some embodiments, the CMP processing system 100 may provide a continuous flow system such that CMP slurry 103 continuously flows into the chamber 113 to continuously replenish the slurry reservoir 115 and used slurry 127 continuously flows out of the chamber 113, while the used slurry 127 is continuously filtered and restored to the original composition and original state of the CMP slurry 103 using the make-up solution 133. Restoring the used slurry 127 allows for the used slurry 127 to be reused in the slurry reservoir 115 while maintaining a quality of the CMP slurry 103 during CMP processing of a single workpiece and during a series of CMP processing of a batch of workpieces.

According to some embodiments, the make-up solution 133 is mixed with the filtered slurry 131 that is released to the supply tank 107 via the second inlet In2 and is mixed with any remaining volume of the CMP slurry 103 directly in the supply tank 107. The agitator 108 of the supply tank 107 continuously stirs the contents of the supply tank 107 such that the used slurry 127 is restored to its original composition and its original state when mixed with the make-up solution 133. Therefore, a quality and consistency of the CMP slurry 103 is maintained throughout the CMP processing of the workpiece 123 and during the series of CMP processing of the batch of workpieces.

According to other embodiments, the filtered slurry 131 and the make-up solution 133 may be mixed prior to being released into the supply tank 107. For example, the filtered slurry 131 and the make-up solution 133 may be provided to a mixing tank to generate a restored CMP slurry consistent with the original composition and the original state of the CMP slurry 103. Once mixed, the restored CMP slurry may be returned to the supply tank 107.

Furthermore, the control unit 101 may initiate a purging of the slurry reservoir 115 at various times, as dictated by the desired CMP process recipe. For example, the control unit 101 may initiate a purging of the slurry reservoir 115 from the chamber 113 in preparation for a subsequent processing of the workpiece 123 or prior to processing another workpiece. Examples of subsequent processing steps may include, but are not limited to: a step of changing slurry abrasives or changing abrasive concentrations between CMP removal processes (e.g., between a bulk CMP removal and a buffing CMP removal, or between a CMP removal of another workpiece using another CMP slurry), a step of filtering the CMP slurry 103, a step of cleaning the workpiece 123, and a step of rinsing the chamber 113 (e.g., after CMP processing of the workpiece 123 has been completed). However, the purging of the slurry reservoir 115 may be initiated by the control unit 101 in preparation for any suitable processing step.

FIG. 1 further illustrates that the plurality of sensors S1-S3 may be arranged or integrally formed within one or more elements of the CMP processing system 100 and may also be arranged in-line of the conduit 109 between connected elements, according to some embodiments. The plurality of sensors S1-S3 instantaneously determine one or more conditions of the respective elements or instantaneously determine characteristics of the CMP slurry 103 as the CMP slurry 103 flows by a respective sensor of the plurality of sensors S1-S3. The plurality of sensors S1-S3 may be communicatively coupled to the control unit 101 to allow for the determined conditions of the respective elements and the determined characteristics of the CMP slurry 103 at the respective locations of the plurality of sensors S1-S3 to be assessed by the control unit 101.

Examples of the plurality of sensors S1-S3 include, but are not limited to, flow meters, electro-acoustic sensors, ultra-sonic abrasive concentration sensors, pH sensors, conductivity sensors, temperature sensors, pressure sensors, combinations thereof, and the like. However, any suitable sensor may be utilized. Examples of conditions of the elements and characteristics of the CMP slurry 103 that may be determined by the plurality of sensors S1-S3 include, but are not limited to, pH levels, temperature levels, volume levels, conductivity levels, ultrasonic attenuation spectrums, particle size distributions, dynamic mobility spectrums, particle zeta potentials, slurry pressures, abrasive particle concentrations, and the like. However, any suitable characteristic of the CMP slurry 103 may be determined by the plurality of sensors S1-S3 and utilized by the control unit 101.

As such, the plurality of sensors S1-S3 instantaneously detects conditions of the respective elements or characteristics of the CMP slurry 103 at the respective locations of the sensors in the CMP processing system 100. The instantaneously detected conditions or characteristics may be provided to the control unit 101 for monitoring and analysis of each of the respective elements and of the CMP slurry 103 at each of the respective locations of the plurality of sensors S1-S3. Thus, the monitoring and analysis performed by the control unit 101 may be performed in real-time or in near real-time. According to some embodiments, the analysis performed by the control unit 101 includes comparing relative conditions of each of the respective elements (e.g., conditions detected within the chamber 113) during CMP processing to certain condition tolerances. The condition tolerances may be dictated, for example, according to a desired CMP processing recipe. Furthermore, the analysis performed by the control unit 101 may also include comparing the instantaneous characteristics of the CMP slurry 103, at each of the respective locations of the plurality of sensors during CMP processing, to certain slurry characteristic tolerances. The slurry characteristic tolerances may be dictated, for example, according to the desired CMP processing recipe.

Based on the analysis of the instantaneous conditions of the elements or the instantaneous characteristics of the CMP slurry 103, the control unit 101 may initiate one or more system processes. The initiation of one or more system processes may include, for example, one or more of: activating or deactivating components of an element to modify one or more conditions of the element, operating valves V1-V4 and activating pumps P1-P3 to allow slurry to flow from one element to another element, and activating the slurry restoration system 150 to provide the make-up solution 133.

As further illustrated in FIG. 1, a first sensor S1 may be integrally formed with or arranged within the chamber 113 to instantaneously determine conditions of the chamber 113 (e.g., a chamber temperature, a chamber pressure, a level of the slurry reservoir 115 within the chamber 113, etc.). In one embodiment the first sensor S1 includes a level sensor which provides a measurement of the depth of the slurry reservoir 115 within the chamber 113. In such an embodiment the level sensor may comprise a first portion which extends from a level below the polishing head to a level above the polishing head in order to provide a suitable reading for the level of the slurry reservoir 115.

The first sensor S1 may also instantaneously determine characteristics of the CMP slurry 103 of the slurry reservoir 115 (e.g., a pH level, a temperature level, a particle zeta potential, an abrasive particle concentration, a concentration of waste, a concentration of impurities, etc.). Also illustrated in FIG. 1, a second sensor S2 may be arranged, for example, in-line of the conduit 109 connecting the second pump P2 and the slurry filter 129 to detect characteristics of the CMP slurry 103 at the location of the second sensor S2. Also, a third sensor S3 may be arranged, for example, in-line of the conduit 109 connecting the slurry filter 129 and the third pump P3 to detect characteristics of the CMP slurry 103 at the location of the third sensor S3. As such, the control unit 101 monitors and analyzes the instantaneous conditions of the elements (e.g., the chamber 113) and characteristics of the slurry at each of the respective locations of the first, second and third sensors S1-S3 (e.g., the CMP slurry 103 within the slurry reservoir 115, the used slurry 127 purged from the chamber 113, or the filtered slurry 131 provided at the output of the slurry filter 129).

Figure 2:
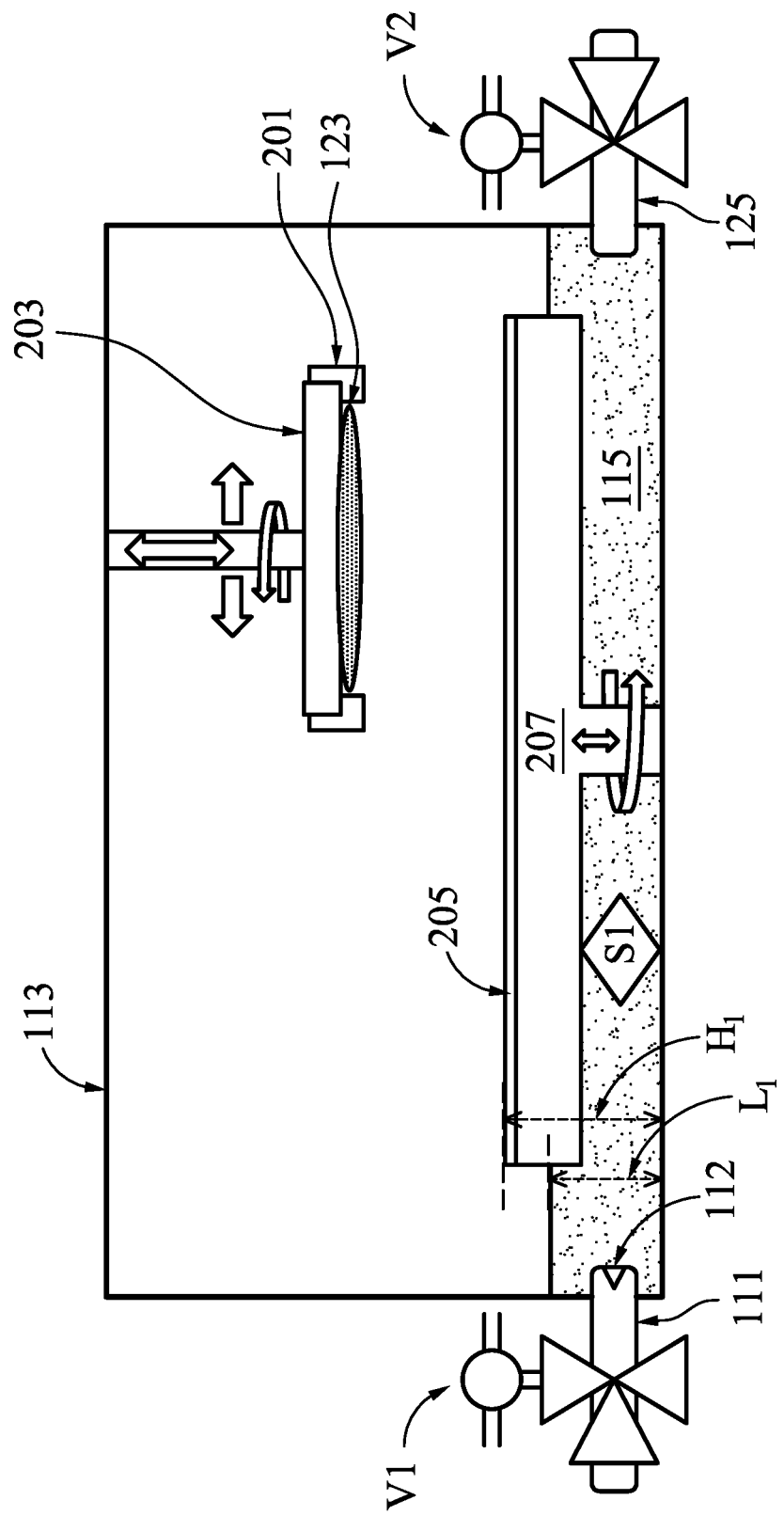
FIG. 2 illustrates details of a chamber and method for preparing for a CMP process, in accordance with some embodiments.

FIG. 2 illustrates details of the chamber 113 of FIG. 1 and a method of preparing the chamber 113 for performing the desired CMP processing of the workpiece 123. Along with the first sensor S1 and the slurry reservoir 115, the chamber 113 includes a polishing head 203 and a platen 207 that are manipulated within the chamber 113 by the control unit 101 during the desired CMP processing of the workpiece 123, according to the desired CMP recipe.

According to an embodiment, in order to prepare for the desired CMP processing of the workpiece 123, the workpiece 123 is attached by a wafer carrier 201 (e.g., a retaining ring) to the polishing head 203. The wafer carrier 201 is adapted to retain the workpiece 123 and to provide a down force of between about 2 psi and about 3 psi in order to prevent the workpiece 123 from slipping during the desired CMP processing. The polishing head 203 is rotatable, adapted to move up and down, and may include a line, hose, or tube for a vacuum which may be used for picking up and retaining the workpiece 123 during the desired CMP process. The workpiece 123 typically comprises a patterned layer of material disposed on a semiconductor wafer that needs planarizing, smoothing, or a reduction in thickness, for example. The workpiece 123 may be picked up by the polishing head 203, for example, by using a vacuum of a load port of a CMP station within a CMP tool. The vacuum may be used to lift the workpiece 123 as the polishing head 203 moves the workpiece 123 up and down within the chamber 113, according to the desired CMP process recipe. After the CMP process is complete, the workpiece 123 is lifted again by the vacuum as the polishing head 203 moves the workpiece 123 up and down within the chamber 113, and the workpiece 123 is returned, for example, to the load port of the CMP station or to another station within the CMP tool.

During preparation for the desired CMP processing, the control unit 101 directs the flow of the CMP slurry 103 from the supply tank 107 through the intake 111 and into the chamber 113 allowing the CMP slurry 103 to pool at the bottom of the chamber 113 and form the slurry reservoir 115, as discussed above. In some embodiments, the intake 111 is arranged at or near a bottom surface of the chamber 113. However, any suitable arrangement of the intake 111 within the chamber 113 may be used.

In some embodiments, the control unit 101 controls the first pump P1 and the first valve V1 to continue flowing the CMP slurry 103 into the chamber 113 until an upper surface of the slurry reservoir 115 has reached a desired level L1 within the chamber 113 or until a desired volume of the CMP slurry 103 has been flowed into the chamber 113. According to an embodiment, the desired level L1 of the slurry reservoir 115 may be between about 130 mm and about 190 mm, such as about 160 mm. However, any suitable level may be utilized for the desired level L1 of the slurry reservoir 115. According to an embodiment, the desired volume of the of the slurry reservoir 115 may be between about 32500 ml and about 47500 ml, such as about 40000 ml. However, any suitable volume may be utilized for the desired volume of the slurry reservoir 115.

The chamber 113 further comprises a platen 207 with a polishing pad 205 secured to a top surface of the platen 207. The platen 207 is adapted to rotate the polishing pad 205 during the desired CMP processing of the workpiece 123. In some embodiments, the platen 207 is adapted to raise and lower the polishing pad within the chamber 113. When the polishing pad 205 is secured to the platen 207, an upper surface of the polishing pad 205 may be arranged at a first height $H_1$ above the bottom surface of the chamber 113. According to an embodiment, the first height $H_1$ may be between about 200 mm and about 220 mm, such as about 210 mm.

The platen 207 may represent any of a high-rate platen, low-rate platen, and a buffing platen. However, the platen 207 may represent any suitable platen for performing the desired CMP processing of the workpiece 123. The polishing pad 205 may represent any type of polishing pad suitable for performing any of a high-rate polishing, a low-rate polishing, and a buffing. However, the polishing pad 205 may represent any suitable pad for performing the desired CMP processing of the workpiece 123. In some embodiments, the platen 207 may be a high-rate platen used for polishing the workpiece 123 with a relatively high polishing rate using the polishing pad 205 having a first coarseness suitable for performing the high-rate polishing of the workpiece 123. According to some embodiments, the platen 207 may be a low-rate platen used for polishing the workpiece 123 with a relatively low polishing rate using the polishing pad 205 having a second coarseness suitable for performing the low-rate polishing of the workpiece 123. The platen 207, being the low-rate platen in some embodiments, may also be used to detect whether a target thicknesses of the workpiece 123 have been reached or not. Still in other embodiments, the platen 207 may be a buffing platen used to buff (e.g., lightly polish) the workpiece 123 using the polishing pad 205 having a third coarseness suitable for performing the buffing of the workpiece 123. The platen 207, being the buffing platen in some embodiments, may also be used to fix defects and scratches, and to further polish the workpiece 123 to achieve the final target thickness of the workpiece 123.

The control unit 101 is communicatively coupled to the platen 207, the polishing head 203, and the first sensor S1. During CMP processing of the workpiece 123, the control unit 101 directs the operations of the platen 207, directs the operations of the polishing head 203, and monitors and analyzes the conditions of the chamber 113 and the characteristics of the CMP slurry 103 of the slurry reservoir 115 based on real-time feedback from the first sensor S1.

During CMP processing of the workpiece 123, the polishing pad 205 is secured to the platen 207 and the workpiece 123 is held by the polishing head 203. Based on the desired CMP recipe, the control unit 101 directs the polishing head 203 to manipulate the workpiece 123 within the chamber 113. For example, the control unit 101 may direct the polishing head 203 to raise the workpiece 123, to lower the workpiece 123, to rotate the workpiece 123, and to move the workpiece 123 in horizontal directions within a plane of the surface of the workpiece 123, according to the desired CMP process recipe.

According to some embodiments, the platen 207 is directed by the control unit 101 to manipulate the polishing pad 205 within the chamber 113 according to the desired CMP process recipe. For example, the control unit 101 may direct the platen 207 to rotate the polishing pad 205 beneath the workpiece 123.

In some embodiments, an output 125 of the chamber 113 is arranged at or near a bottom surface of the chamber 113. However, any suitable arrangement of the output 125 within the chamber 113 may be used. The second valve V2 is arranged at the output 125 of the chamber 113 and the second pump P2 is connected via the conduit 109 to the second valve V2. In order to control the flow of the CMP slurry 103 from the slurry reservoir 115, the control unit 101 controls the second valve V2 to open and controls the second pump P2 to begin drawing the CMP slurry 103 of the slurry reservoir 115 out of the chamber 113.

Based on one or more of the conditions and the characteristics determined by the first sensor S1, the control unit 101 may control the components of the CMP processing system 100 to perform one or more actions. For example, based on the determined conditions of the chamber 113, the control unit 101 may direct the chamber 113 (e.g., a heating element, a pressure valve, etc.) to adjust one or more of the chamber temperature and the chamber pressure, according to the desired CMP process recipe. As another example, based on the determined characteristics of the CMP slurry 103 in the slurry reservoir 115 and according to the desired CMP process recipe, the control unit 101 may direct the first and second valves V1-V2 and the first and second pumps P1-P2 to initiate one or more of: a purging of the CMP slurry 103 from the chamber 113, a flowing of the CMP slurry 103 from the supply tank 107 into the chamber 113, a flowing of the CMP slurry 103 from the slurry reservoir 115 out of the chamber 113, and an adjusting of a level of the slurry reservoir 115 in the chamber 113.

During the desired CMP processing, the first sensor S1 instantaneously determines a concentration of one or more of the slurry additives and a concentration of waste and impurities in the slurry reservoir 115. The control unit 101 monitors and analyzes the characteristics of the slurry reservoir 115, as determined by the first sensor S1. Based on the analysis of the characteristics of the slurry reservoir 115, the control unit 101 may determine a degree to which the CMP slurry 103 in the slurry reservoir 115 has become depleted, unbalanced, contaminated or otherwise corrupted and may determine whether the CMP slurry 103 has become inadequate to perform the desired CMP processing, as dictated by the CMP process recipe. Once the control unit 101 has determined that the CMP slurry 103 of the slurry reservoir 115 is deemed no longer adequate or, otherwise referred herein as, "used slurry" 127, the control unit 101 may initiate a purging of the used slurry 127 from the chamber 113. In some embodiments, the control unit 101 may determine to purge a portion of the used slurry 127 from the chamber 113 with a remaining portion of the used slurry 127 staying in the slurry reservoir 115. In other embodiments, the control unit 101 may determine to purge all of the used slurry 127 from the chamber 113.

Figure 3:
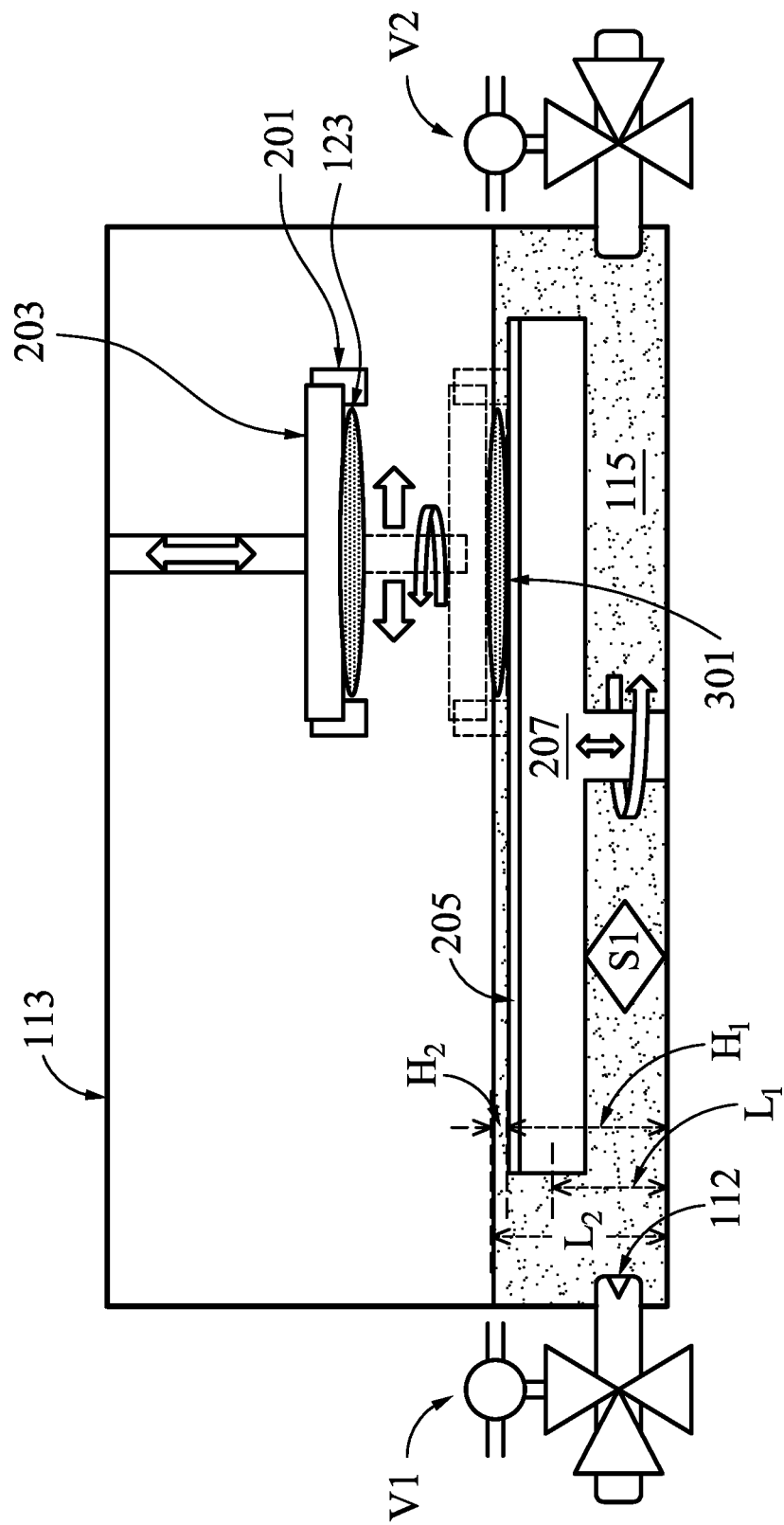
FIG. 3 illustrates a method of performing a CMP processing of a workpiece using the chamber of FIG. 2, in accordance with some embodiments.

FIG. 3 illustrates a method of performing the CMP processing of the workpiece 123, according to some embodiments. Once the chamber 113 has been prepared as discussed above with regard to FIG. 2, the control unit 101 may control a level of the slurry reservoir 115 and may control one or more of manipulations of the polishing head 203 and one or more manipulations of the platen 207, according to some embodiments.

As illustrated in FIG. 3, the control unit 101 may initially determine a second level $L_2$ to which the surface of the slurry reservoir 115 is to be raised during the CMP processing of the workpiece 123. In some embodiments, the desired CMP recipe may dictate a fixed level for the second level $L_2$. In other embodiments, the desired CMP recipe may dictate a fixed height above the upper surface of the polishing pad 205 for the second level $L_2$. As discussed above with respect to FIG. 2, the height of the upper surface of the polishing pad 205 is a first height H1. The first height H1 may be at a fixed height within the chamber 113 and the first height H1, for example, may be set as a known parameter within or otherwise provided to the control unit 101, according to some embodiments. In other embodiments, the first height $H_1$ may be measured by the first sensor S1 and communicated to the control unit 101.

The second level $L_2$ may be determined based on the first height $H_1$ of the polishing pad 205. For example, the desired CMP recipe may indicate that the upper surface of slurry reservoir 115 is to be at least a second height $H_2$ above the upper surface of the polishing pad 205 during the desired CMP processing of the workpiece 123. In some embodiments, the second height $H_2$ may be between about 3 mm and about 7 mm, such as about 5 mm.

In an embodiment, once the second height $H_2$ has been determined, the control unit 101 may determine a supplemental volume of the CMP slurry 103 to add to the slurry reservoir 115 in order to raise the level of the slurry reservoir 115 from the first level $L_1$ to the second level $L_2$. Based on the supplemental volume, the control unit 101 may direct the first pump P1 and the first valve V1 to flow an amount of the CMP slurry 103 from the supply tank 107 into the chamber 113 until the supplemental volume has been added to the slurry reservoir 115. As such, the platen 207 is submerged in the slurry reservoir 115 with the upper surface of the polishing pad 205 being below the second level $L_2$ by at least the second height $H_2$.

Once the platen 207 has been submerged in the slurry reservoir 115, the control unit 101 begins the desired CMP processing of the workpiece 123 by directing the polishing head 203 to lower the workpiece 123 into the slurry reservoir 115 and begin rotating the workpiece 123 while pressing the surface of the workpiece 123 into the upper surface of the polishing pad 205. The polishing head 203 may also manipulate the workpiece 123 by moving the workpiece 123 radially along the surface of the polishing pad 205 as the workpiece 123 is rotated by the polishing head 203 and as the polishing pad 205 rotates beneath the workpiece 123. With the polishing pad 205 submerged within the slurry reservoir 115 and the surface of the workpiece 123 lowered into the slurry reservoir 115 and making contact with the polishing pad 205 during the desired CMP processing, the CMP slurry 103 is uniformly distributed at an interface (e.g., a wafer/pad interface) between the surface of the workpiece 123 and the polishing pad 205. As such, no ramp up time (e.g., 5 or more seconds) is spent to evenly distribute the CMP slurry 103 as would be required in a chamber design that dispenses the CMP slurry 103 from a slurry arm onto the polishing pad at a slurry drop point. Therefore, a savings in process time may be achieved during the desired CMP processing using the chamber 113 with the slurry reservoir 115.

As illustrated in FIG. 3, a wafer/pad interface 301 is formed between the surface of the workpiece 123 and a portion of the surface of the polishing pad 205 where the two surfaces are pressed together below the upper surface of the slurry reservoir 115. As such, the CMP slurry 103 of the slurry reservoir 115 is evenly distributed at the wafer/pad interface 301 during the desired CMP processing of the workpiece 123. As the rotating workpiece 123 is pressed into the surface of the polishing pad 205, the wafer/pad interface 301 is maintained below the upper surface of the slurry reservoir 115 thereby providing the even distribution of the CMP slurry 103 during the CMP processing of the workpiece 123. The relative movements of the polishing pad 205 and the surface of the workpiece 123 coupled with the one or more slurry additives (e.g., abrasive particles and/or reactive chemicals) of the CMP slurry 103 at the wafer/pad interface 301 allow the CMP process to planarize the surface of the workpiece 123 by means of both physical and chemical forces. With the CMP slurry 103 being evenly distributed at the wafer/pad interface 301, a highly controlled planarization of the workpiece 123 may be achieved within short polishing times.

Furthermore, the polishing head 203 may apply a down force to the workpiece 123 in order to force the workpiece 123 into the polishing pad 205 to maintain the wafer/pad interface 301 while the workpiece 123 is rotated, according to the desired CMP recipe. In some embodiments, the down force applied is uniform across the wafer/pad interface 301. In other embodiments, the polishing head 203 may apply local down forces corresponding to local thicknesses of the workpiece 123, based on the desired CMP recipe. The applied local down forces may be non-uniform across the wafer/pad interface 301.

According to some embodiments, the platen 207 applies a back force to the workpiece 123 in order to force the polishing pad 205 against the workpiece 123 and to prevent bending of the workpiece 123 while maintaining the wafer/pad interface 301 as the polishing pad 205 is rotated, according to the desired CMP recipe. In some embodiments, the back force applied by the platen 207 to the polishing pad may be between about 0.6 psi and about 6 psi, such as about 3 psi.

In some embodiments, the polishing head 203 and the platen 207 may perform a high-rate polishing of the surface of the workpiece 123 according to the desired CMP recipe. When performing a high-rate polishing of the surface of the workpiece 123, the polishing head 203 may rotate the workpiece 123 at speeds between about 30 rpm and about 170 rpm, such as about 90 rpm and the platen 207 may rotate the polishing pad 205 at speeds between about 30 rpm and about 170 rpm, such as about 90 rpm. As such, a high-rate polishing of the surface of the workpiece 123 may be performed within a polishing of time of between about 0 sec and about 180 sec, such as about 90 sec.

Figure 4:
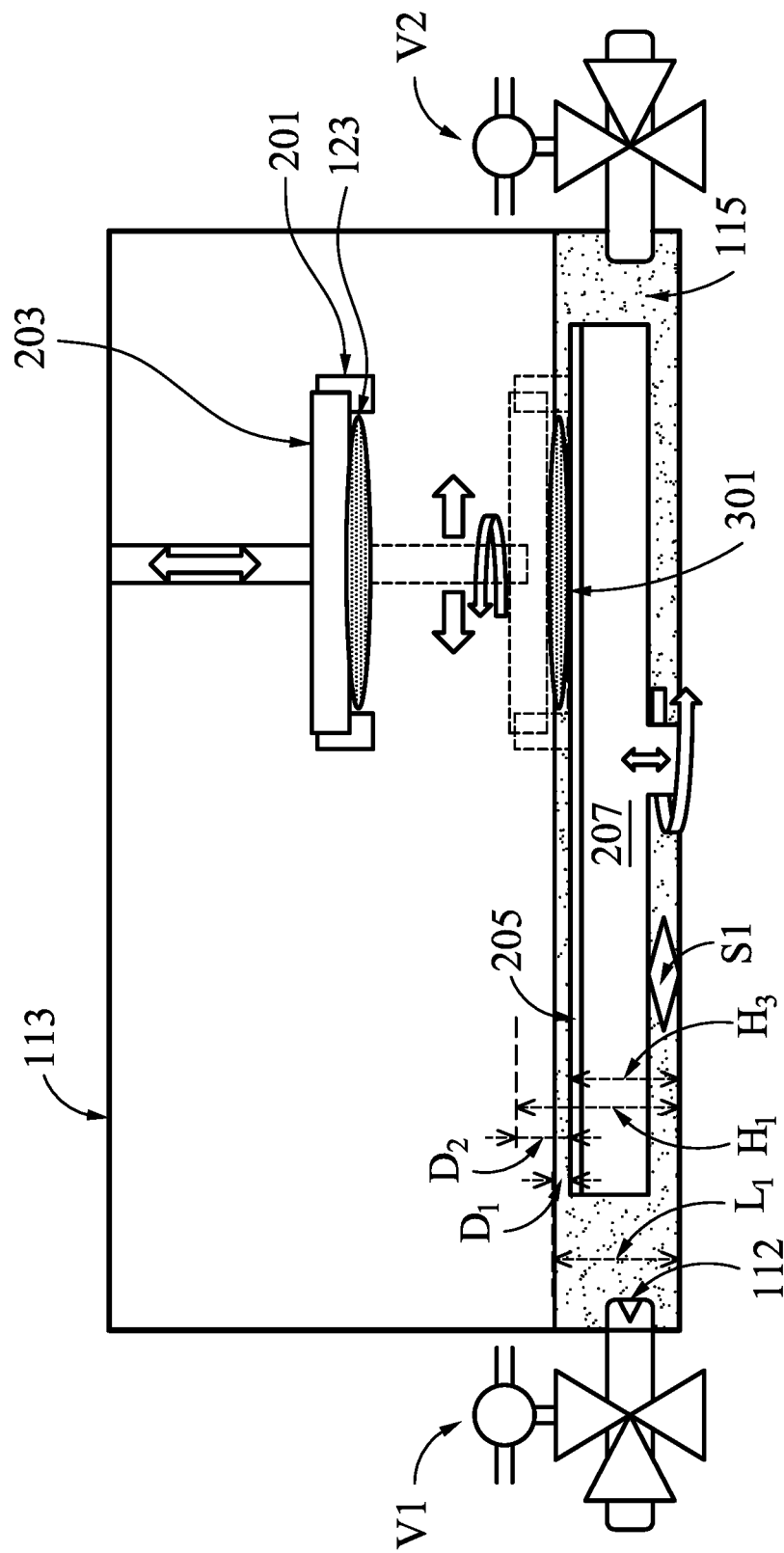
FIG. 4 illustrates a method of performing a CMP processing of a workpiece using the chamber of FIG. 2, in accordance with some embodiments.

FIG. 4 illustrates another embodiment of performing the CMP processing of the workpiece 123, according to some embodiments. In this embodiment, rather than raising the level of the slurry reservoir 115 within the chamber 113, the polishing pad 205 may be lowered within the chamber 113. Such a movement relative to the slurry reservoir 115 allows for another method of submerging the surface of the polishing pad 205 into the slurry reservoir 115.

In this embodiment, once the chamber 113 has been prepared as discussed above with regard to FIG. 2, the control unit 101 may determine a second distance $D_2$ to lower the polishing pad 205 from the first height $H_1$ to a third height $H_3$, the third height $H_3$ being the desired first distance $D_1$ below the surface of the slurry reservoir 115. According to some embodiments, the first distance $D_1$ may be determined based on the first height $H_1$, the first level $L_1$ of the surface of the slurry reservoir 115 and the desired first distance $D_1$ below first level $L_1$, according to the desired CMP recipe.

Once the second distance $D_2$ has been determined, the control unit 101 may lower the polishing pad 205 by the second distance $D_2$ to the third height $H_3$. Once lowered to the third height $H_3$, the polishing pad 205 is submerged within the slurry reservoir 115 with the upper surface of the polishing pad 205 being arranged at the desired first distance $D_1$ below the surface of the slurry reservoir 115. In some embodiments, the third height $H_3$ may be between about 80 mm and about 120 mm, such as about 100 mm. However, any suitable height for performing the desired CMP processing of the workpiece 123 may be utilized as the third height $H_3$. In some embodiments, the second distance $D_2$ may be between about 60 mm and about 100 mm, such as about 80 mm. However, any suitable distance for performing the desired CMP processing of the workpiece 123 may be utilized as the second distance $D_2$.

Once the platen 207 has been submerged in the slurry reservoir 115, the control unit 101 begins the desired CMP processing of the workpiece 123 by directing the polishing head 203 to lower the workpiece 123 into the slurry reservoir 115 and begins rotating the workpiece 123 while pressing the surface of the workpiece 123 into the upper surface of the polishing pad 205. The polishing head 203 may also manipulate the workpiece 123 by moving the workpiece 123 radially along the surface of the polishing pad 205 as the workpiece 123 is rotated by the polishing head 203 and as the polishing pad 205 rotates beneath the workpiece 123, according to the desired CMP recipe.

As further illustrated in FIG. 4, the wafer/pad interface 301 is formed between the surface of the workpiece 123 and a portion of the surface of the polishing pad 205 where the two surfaces are pressed together below the upper surface of the slurry reservoir 115. As such, the CMP slurry 103 of the slurry reservoir 115 is evenly distributed at the wafer/pad interface 301 during the desired CMP processing of the workpiece 123. As the rotating workpiece 123 is pressed into the surface of the polishing pad 205, the wafer/pad interface 301 is maintained below the upper surface of the slurry reservoir 115 thereby providing the even distribution of the CMP slurry 103 during the CMP processing of the workpiece 123. The relative movements of the polishing pad 205 and the surface of the workpiece 123 coupled with the one or more slurry additives (e.g., abrasive particles and/or reactive chemicals) of the CMP slurry 103 at the wafer/pad interface 301 allow the CMP process to planarize the surface of the workpiece 123 by means of both physical and chemical forces. With the CMP slurry 103 being evenly distributed at the wafer/pad interface 301, a highly controlled planarization of the workpiece 123 may be achieved within short polishing times.

In some embodiments, the control unit 101 monitors and analyzes a level of the slurry reservoir 115. In order to maintain the level of the slurry reservoir 115 and to keep the workpiece 123 submerged within the slurry reservoir 115 during CMP processing, the control unit 101 may control one or more of the valve V1-V3 and one or more of the pumps P1-P3 to adjust the flows of the CMP slurry 103, the filtered slurry 131, and the used slurry 127 into and out of the chamber 113. Keeping the workpiece 123 submerged within the slurry reservoir 115 ensures that a uniform distribution of the CMP slurry 103 is maintained at the wafer/pad interface 301 and avoids non-uniform slurry distribution during CMP processing which allows for a highly controlled within wafer (WiW) leveling of the surface of the workpiece 123. In some embodiments, the WiW leveling may be controlled to within variances of between about 100 Å and about 30 Å, such as about 50 Å.

Embodiments of the CMP processing system 100 and methods described herein provide improved polish stability and improved WiW thickness control, even when using short polish times (e.g., about 1-3 seconds). Furthermore, the space within the chamber 113 may be minimized and material costs may be realized based on the design of the chamber 113 allowing for the CMP slurry to flow into and out of the chamber 113 via the intake 111 and the output 125 arranged at or near the bottom of the chamber 113. Further space and cost savings may be realized by performing the CMP processing of the workpiece 123 below the surface of the slurry reservoir 115 instead of using a slurry arm and nozzle to dispense the CMP slurry 103 to a slurry drop point on the top surface of the polishing pad 205. Furthermore, performing the CMP processing of the workpiece 123 below the surface of the slurry reservoir 115 allows for the uniform distribution of the CMP slurry 103 at the wafer/pad interface 301. Whereas, a non-uniform distribution of slurry at the wafer/pad interface 301 occurs when dispensed from a slurry arm at a drop point on a surface of the polishing pad 205. The non-uniform distribution of the slurry dispensed from the slurry arm is caused by the difference between the location of the slurry drop point and the location of the wafer/pad interface 301. Further cost savings and production efficiencies may also be realized by reusing and recycling the CMP slurry 103 in the slurry reservoir 115.

The CMP processing system 100 provides a highly uniform polish behavior with increased process stability, even in the presence of varied topography of the wafer/pad interface 301 (e.g., due to coarseness of the polishing pad 205 and/or due to roughness of within wafer (WiW) surfaces). Furthermore, the CMP processing system 100 provides a highly uniform polish behavior with increased process stability, even when using significant polishing down force causing the polishing pad 205 to bend even when using short polish times (e.g., about 1-2 seconds). Thus, improved WiW thickness control is realized when using the chamber 113 with the slurry reservoir 115, thereby further enhancing production yield.

Figure 5:
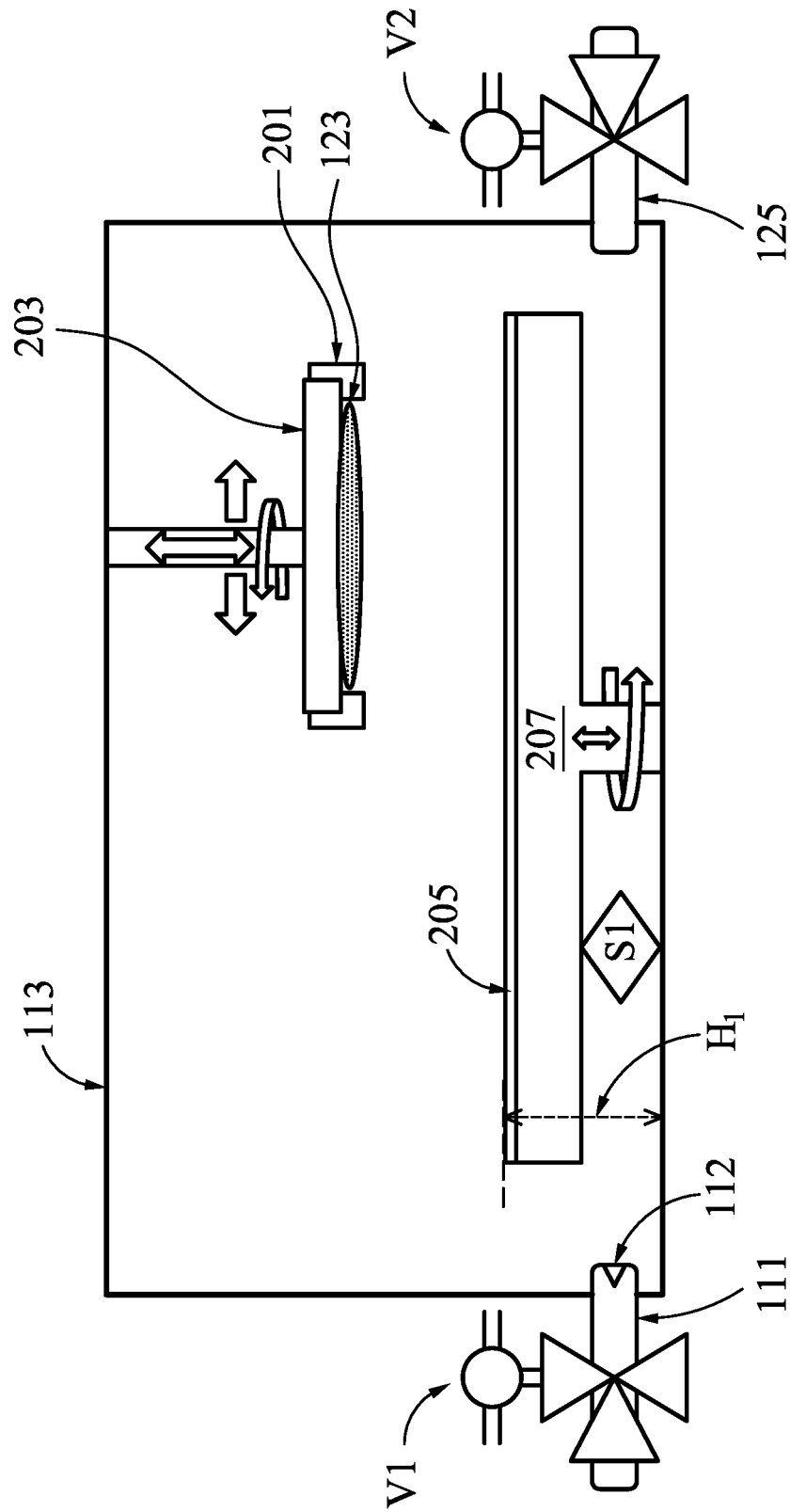
FIG. 5 illustrates a purging of a slurry reservoir from the chamber, in accordance with some embodiments.

FIG. 5 illustrates a purging of the slurry reservoir 115, according to some embodiments. Once the desired CMP processing of the workpiece 123 is completed, the CMP processing system 100 controls the polishing head 203 to raise the workpiece 123 away from the polishing pad 205, thereby separating the workpiece 123 from contact with the polishing pad 205 and eliminating the wafer/pad interface 301 as shown in FIG. 3 and in FIG. 4. Once the workpiece 123 has been raised and separated from contact with the polishing pad 205, the used slurry 127 of the slurry reservoir 115 may be purged from the chamber 113 via the output 125 of the chamber 113, as discussed in detail above with regard to FIG. 1.

Embodiments disclosed herein relate to the CMP processing system 100 and CMP polish method to improve within wafer (WiW) performance via the chamber 113 including a slurry reservoir 115. In some embodiments, the system includes the chamber 113 design that allows for uniform distribution of the slurry at a wafer/pad interface 301 during a CMP process and that avoids non-uniform distribution of the slurry at the wafer/pad interface 301 due to differences between a location of the pad/wafer interface and a location of a slurry drop point. The CMP processing system 100 provides a highly uniform polish behavior with increased process stability, even in the presence of varied topography of wafer/pad roughness and/or varied topographies of wafer-to-wafer (WtW) surfaces, even when using significant polish down forces causing the polishing pad 205 to bend, and even when using short polish times (e.g., about 1-2 seconds). As the CMP processing system 100 provides the highly uniform polish behavior with increased process stability, improved control of a WiW thickness profile may be realized.

Figure 6:
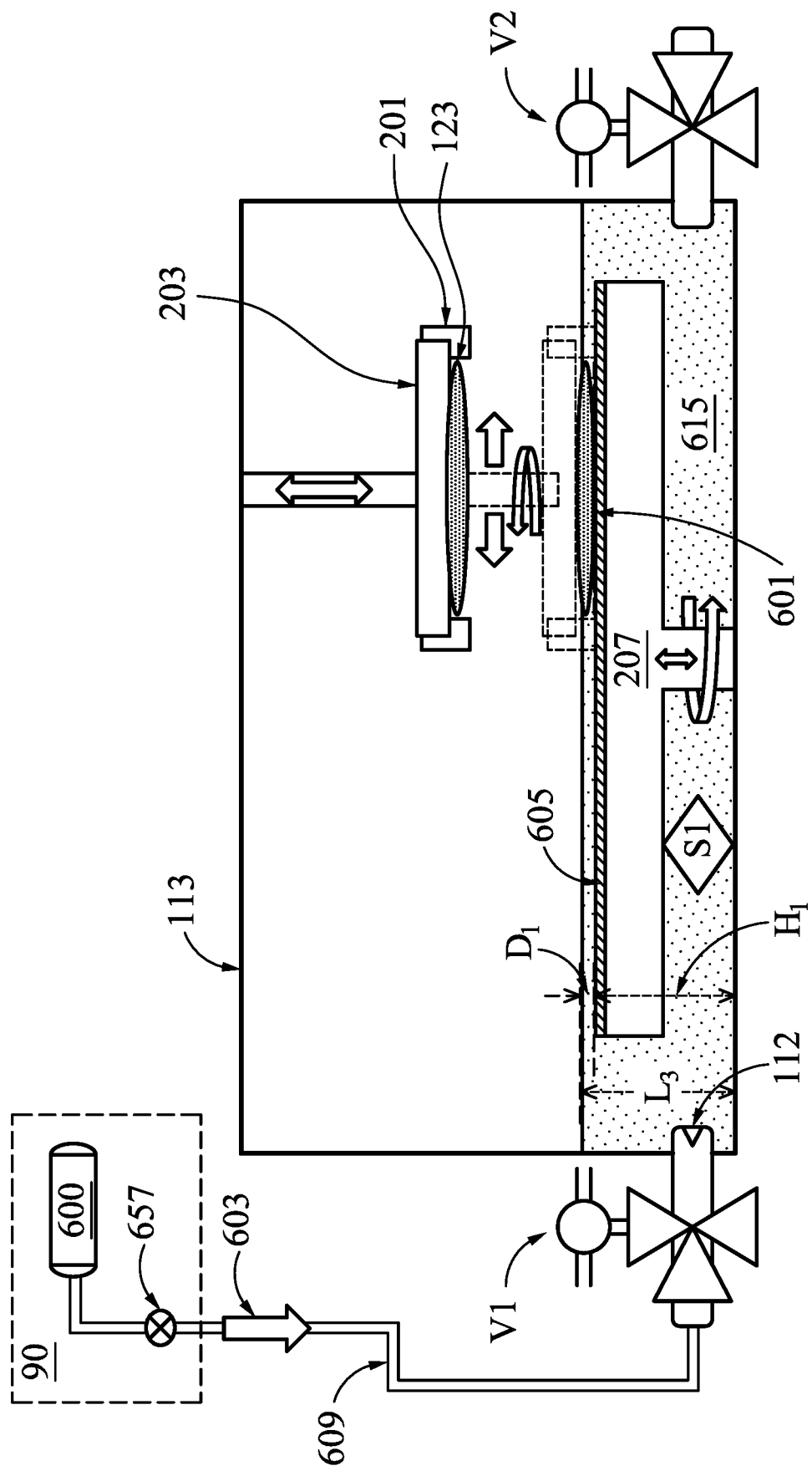
FIG. 6 illustrates a method of performing a cleaning process of a workpiece using the chamber of FIG. 2, in accordance with some embodiments.

FIG. 6 illustrates a method of performing a cleaning process of a workpiece using the chamber of FIG. 2, in accordance with some embodiments. Once the chamber 113 has been purged of all slurry, as discussed above with regard to FIG. 5, the control unit 101 may control a cleaning process for the workpiece 123. As such, the control unit 101 may direct the valves V1-V4 and pumps P1-P5 to supply a cleaning solution 603 from the supply tank 107 or, for example, from a cleaning supply tank 600 of the slurry distribution system 90. According to some embodiments, the cleaning solution 603 may comprise one or more of de-ionized water, SC-1, $NH_4OH$, HF, citric acid, or other chemicals, for example.

The cleaning solution 603 may be provided via a cleaning solution feedline 609 connected between a second multi-port manifold 657 of the slurry distribution system 90 to flow through the intake 111 of the chamber 113. As the cleaning solution 603 continues to flow into the chamber 113, a cleaning solution reservoir 615 is formed therein. The control unit 101 may control a level of the cleaning solution reservoir 615 and may control one or more of manipulations of the polishing head 203 and one or more manipulations of the platen 207 during the cleaning process of the workpiece 123, according to some embodiments.

As illustrated in FIG. 6, the control unit 101 may initially determine a third level $L_3$ to which the surface of the cleaning solution reservoir 615 is to be raised during the cleaning processing of the workpiece 123. In some embodiments, the desired recipe may dictate a fixed level for the third level $L_3$, a fixed height above the upper surface of a cleaning pad 605 for the third level $L_3$. The height of the upper surface of the cleaning pad 605 and the level of the surface of the cleaning solution reservoir 615 may be determined by the control unit 101 using the methods described above for determining the height of the upper surface of the polishing pad 205 and the surface of the slurry reservoir 115.

Once the platen 207 has been submerged in the cleaning solution reservoir 615, the control unit 101 begins the desired cleaning processing of the workpiece 123 by directing the polishing head 203 to lower the workpiece 123 into the cleaning solution reservoir 615 and begin rotating the workpiece 123 while pressing the surface of the workpiece 123 into the upper surface of the cleaning pad 605. The polishing head 203 may also manipulate the workpiece 123 by moving the workpiece 123 radially along the surface of the cleaning pad 605 as the workpiece 123 is rotated by the polishing head 203 and as the cleaning pad 605 rotates beneath the workpiece 123. With the cleaning pad 605 submerged within the cleaning solution reservoir 615 and the surface of the workpiece 123 lowered into the cleaning solution reservoir 615 and making contact with the cleaning pad 605 during the desired cleaning processing, the cleaning solution 603 is uniformly distributed at a wafer/pad cleaning interface (e.g., a wafer/pad interface 601) between the surface of the workpiece 123 and the cleaning pad 605.

As illustrated in FIG. 6, a wafer/pad cleaning interface 601 is formed between the surface of the workpiece 123 and a portion of the surface of the cleaning pad 605 where the two surfaces are pressed together below the upper surface of the cleaning solution reservoir 615. As such, the cleaning solution 603 of the cleaning solution reservoir 615 is evenly distributed at the wafer/pad cleaning interface 601 during the desired cleaning processing of the workpiece 123. As the rotating workpiece 123 is pressed into the surface of the cleaning pad 605, the wafer/pad cleaning interface 601 is maintained below the upper surface of the cleaning solution reservoir 615 thereby providing the even distribution of the cleaning solution 603 during the cleaning processing of the workpiece 123. The relative movements of the cleaning pad 605 and the surface of the workpiece 123 coupled with the cleaning solution 603 at the wafer/pad cleaning interface 601 allow the cleaning process to remove waste and impurities from the surface of the workpiece 123 by means of both physical and chemical forces. With the cleaning solution 603 being evenly distributed at the wafer/pad cleaning interface 601, a highly controlled cleaning of the workpiece 123 may be achieved within short cleaning times.

In accordance with an embodiment, a method includes attaching a semiconductor wafer to a polishing head within a chamber; placing a polishing pad on a platen within the chamber; flowing a slurry into the chamber to form a slurry reservoir; and performing a chemical mechanical polishing process at an interface between a surface of the semiconductor wafer and the polishing pad, the interface being below an upper surface of the slurry reservoir. In an embodiment, the method further includes raising the surface of the slurry reservoir to cover a surface of the polishing pad prior to the performing the chemical mechanical polishing process. In an embodiment, the method further includes lowering the polishing head into the slurry reservoir to form the interface. In an embodiment, the method further includes lowering the polishing head to cover a surface of the polishing pad with the slurry prior to the performing the chemical mechanical polishing process. In an embodiment, the method further includes lowering the polishing head into the slurry reservoir to form the interface. In an embodiment, the method further includes purging the slurry from the chamber; and flowing a cleaning solution into the chamber to create a cleaning reservoir.

In accordance with another embodiment, a method includes securing a substrate to a wafer carrier of a polishing head within a chamber; attaching a polishing pad to a platen within the chamber, an upper surface of the polishing pad being at a first height; forming a slurry reservoir within the chamber, an upper surface of the slurry reservoir being at a level below the first height; lowering the platen to submerge the polishing pad in the slurry reservoir; and performing a chemical mechanical polishing process on a surface of the substrate below the upper surface of the slurry reservoir. In an embodiment the forming the slurry reservoir comprises flowing a slurry into the chamber at a point below the platen. In an embodiment the method further includes purging a first slurry of the slurry reservoir from the chamber; flowing a second slurry into the chamber to form a second slurry reservoir in the chamber; and performing a second chemical mechanical polishing process below an upper surface of the a second slurry reservoir. In an embodiment the second slurry is different from the first slurry. In an embodiment the method further includes filtering the first slurry that is purged from the chamber to provide a filtered slurry; and using at least a portion of the filtered slurry as the second slurry. In an embodiment the method further includes filtering the first slurry that is purged from the chamber to provide a filtered slurry; mixing a make-up solution to restore depleted slurry additives in the filtered slurry to form a recycled slurry; and using the recycled slurry as the second slurry. In an embodiment the performing the chemical mechanical polishing process comprises lowering the substrate into the slurry reservoir. In an embodiment the method further includes purging a slurry of the slurry reservoir from the chamber; and flowing a cleaning solution into the chamber to form a cleaning reservoir in the chamber; and performing a cleaning process below an upper surface of the cleaning reservoir.

In accordance with yet another embodiment a system includes a chamber comprising a slurry intake; a platen housed within the chamber; and a polishing pad housed within the chamber, wherein a delivery orifice of the slurry intake is located below an upper surface of the polishing pad. In an embodiment the system further includes a level sensor located within the chamber. In an embodiment the level sensor is located at least partially above the polishing pad. In an embodiment the system further includes a slurry reservoir located within the chamber, the slurry reservoir covering the polishing pad. In an embodiment the system further includes a motor located to move the polishing pad in a first direction, the first direction being perpendicular to a rotational motion of the polishing pad. In an embodiment the system further includes a filter connected to an output of the chamber; and a restoration system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   attaching a semiconductor wafer to a polishing head within a chamber;
   placing a polishing pad on a platen within the chamber;
   flowing a slurry into the chamber to form a slurry reservoir, wherein at an end of the flowing the slurry into the chamber the slurry reservoir has an upper surface that is planar from a first side of the chamber to a second side of the chamber opposite the first side; and
   performing a chemical mechanical polishing process at an interface between a surface of the semiconductor wafer and the polishing pad, the interface being below the upper surface of the slurry reservoir.

2. The method of claim 1, further comprising raising the surface of the slurry reservoir to cover a surface of the polishing pad prior to the performing the chemical mechanical polishing process.

3. The method of claim 1, further comprising lowering the polishing head into the slurry reservoir to form the interface.

4. The method of claim 1, further comprising lowering the polishing head to cover a surface of the polishing pad with the slurry prior to the performing the chemical mechanical polishing process.

5. The method of claim 4, further comprising lowering the polishing head into the slurry reservoir to form the interface.

6. The method of claim 1, further comprising:
   purging the slurry from the chamber; and
   flowing a cleaning solution into the chamber to create a cleaning solution reservoir.

7. A method, comprising:
   securing a substrate to a wafer carrier of a polishing head within a chamber;
   attaching a polishing pad to a platen within the chamber, an upper surface of the polishing pad being at a first height;
   forming a slurry reservoir within the chamber, an upper surface of the slurry reservoir being at a level below the first height;
   lowering the platen to submerge the polishing pad in the slurry reservoir after the forming the slurry reservoir, the lowering the platen changing the relative position of the platen relative to a bottom surface of the chamber; and
   performing a chemical mechanical polishing process on a surface of the substrate below the upper surface of the slurry reservoir.

8. The method of claim 7, wherein the forming the slurry reservoir comprises flowing a slurry into the chamber at a point below the platen.

9. The method of claim 7, further comprising:
   purging a first slurry of the slurry reservoir from the chamber;
   flowing a second slurry into the chamber to form a second slurry reservoir in the chamber; and
   performing a second chemical mechanical polishing process below an upper surface of the a second slurry reservoir.

10. The method of claim 9, wherein the second slurry is different from the first slurry.

11. The method of claim 9, further comprising:
    filtering the first slurry that is purged from the chamber to provide a filtered slurry; and
    using at least a portion of the filtered slurry as the second slurry.

12. The method of claim 9, further comprising:
    filtering the first slurry that is purged from the chamber to provide a filtered slurry;
    mixing a make-up solution to restore depleted slurry additives in the filtered slurry to form a recycled slurry; and
    using the recycled slurry as the second slurry.

13. The method of claim 7, wherein the performing the chemical mechanical polishing process comprises lowering the substrate into the slurry reservoir.

14. The method of claim 7, further comprising:
    purging a slurry of the slurry reservoir from the chamber; and
    flowing a cleaning solution into the chamber to form a cleaning solution reservoir in the chamber; and
    performing a cleaning process below an upper surface of the cleaning solution reservoir.

15. A method of manufacturing a semiconductor device, the method comprising:
    housing a polishing pad within a chamber, the chamber comprising a slurry intake; and
    placing a semiconductor wafer within the chamber;
    introducing slurry into the chamber through the slurry intake, the slurry intake located below the polishing pad, wherein the slurry is introduced into the chamber below the polishing pad; and
    placing the semiconductor wafer into physical contact with the polishing pad while the polishing pad is submerged within the slurry.

16. The method of claim 15, further comprising sensing a level of the slurry within the chamber with a level sensor.

17. The method of claim 16, wherein the level sensor is located at least partially above the polishing pad.

18. The method of claim 15, further comprising a slurry reservoir located within the chamber, the slurry reservoir covering the polishing pad.

19. The method of claim 15, further comprising moving the polishing pad to submerge the polishing pad within the slurry.

20. The method of claim 15, further comprising adding slurry into the chamber to submerge the polishing pad within the slurry.

* * * * *